United States Patent
Saly et al.

(10) Patent No.: US 9,685,325 B2
(45) Date of Patent: Jun. 20, 2017

(54) CARBON AND/OR NITROGEN INCORPORATION IN SILICON BASED FILMS USING SILICON PRECURSORS WITH ORGANIC CO-REACTANTS BY PE-ALD

(71) Applicant: Applied Materials, Inc., Santa Clara, CA (US)

(72) Inventors: Mark Saly, Santa Clara, CA (US); David Thompson, San Jose, CA (US); Jessica Sevanne Kachian, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/795,521

(22) Filed: Jul. 9, 2015

(65) Prior Publication Data
US 2016/0020091 A1   Jan. 21, 2016

Related U.S. Application Data

(60) Provisional application No. 62/026,643, filed on Jul. 19, 2014.

(51) Int. Cl.
*H01L 21/31* (2006.01)
*H01L 21/02* (2006.01)
*C23C 16/32* (2006.01)
*C23C 16/36* (2006.01)
*C23C 16/455* (2006.01)

(52) U.S. Cl.
CPC ...... *H01L 21/02529* (2013.01); *C23C 16/325* (2013.01); *C23C 16/36* (2013.01); *C23C 16/4554* (2013.01); *C23C 16/45531* (2013.01); *H01L 21/0228* (2013.01); *H01L 21/0262* (2013.01); *H01L 21/02167* (2013.01); *H01L 21/02211* (2013.01); *H01L 21/02274* (2013.01); *H01L 21/02532* (2013.01); *H01L 21/02579* (2013.01)

(58) Field of Classification Search
None
See application file for complete search history.

(56) References Cited

U.S. PATENT DOCUMENTS

| | | | |
|---|---|---|---|
| 4,914,063 A * | 4/1990 | Pugar | C04B 35/571 501/89 |
| 7,135,207 B2 | 11/2006 | Min et al. | |
| 7,727,864 B2 | 6/2010 | Elers et al. | |
| 8,728,956 B2 | 5/2014 | LaVoie et al. | |
| 9,076,646 B2 | 7/2015 | Sims et al. | |
| 2006/0286775 A1 * | 12/2006 | Singh | C23C 16/0227 438/478 |
| 2008/0102613 A1 | 5/2008 | Elers | |
| 2009/0291232 A1 * | 11/2009 | Washio | C23C 16/402 427/569 |
| 2010/0193955 A1 | 8/2010 | Milligan et al. | |
| 2014/0030448 A1 | 1/2014 | Bowen et al. | |
| 2014/0356549 A1 * | 12/2014 | Varadarajan | C23C 16/325 427/568 |

* cited by examiner

*Primary Examiner* — Robert Bachner
(74) *Attorney, Agent, or Firm* — Servilla Whitney LLC

(57) ABSTRACT

Methods for the deposition of a silicon-containing film using an organic reactant, a silicon precursor and a plasma.

19 Claims, 3 Drawing Sheets

CARBON AND/OR NITROGEN INCORPORATION IN SILICON BASED FILMS USING SILICON PRECURSORS WITH ORGANIC CO-REACTANTS BY PE-ALD

CROSS-REFERENCE TO RELATED APPLICATIONS

This application claims priority to U.S. Provisional Application No. 62/026,643, filed Jul. 19, 2014, the entire disclosure of which is hereby incorporated by reference herein.

TECHNICAL FIELD

Embodiments of the disclosure relate generally to methods of depositing thin films. In particular, embodiments of the disclosure relate to processes for the deposition and doping of Si-containing films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect ratio structures.

Conformal coverage with low pattern loading effect of dielectric films on high aspect ratio structures is a critical requirement as device nodes shrink down to below 45 nm. Furthermore, silicon nitride thin films are a commonly used dielectric throughout the semiconductor industry, but there is increasing needs for dielectric materials with lower dielectric constant (k) values and with lower etch rates in acid-based clean solutions.

Silicon carbide (oxy)nitride (SiCON/SiCN) films can exhibit some of these favorable qualities, but deposition of SiCON/SiCN films from furnace processes has several drawbacks. For example, these drawbacks include a high temperature requirement ($\geq 550°$ C.), few capabilities to engineer film compositions and bonding structures. These properties impact wet etch resistance and electrical stability during thermal cycling for front-end of line (FEOL) applications. Films deposited via plasma enhanced chemical vapor deposition (PE-CVD) at lower temperature have poor step coverage due to directionality of the radicals' fluxes.

Accordingly, there is a need for improved methods for depositing various Si containing films such as SiCN.

SUMMARY

One or more embodiment of the disclosure are directed to methods of depositing a film on a substrate. At least a portion of the substrate is exposed to a silicon-containing precursor to form a silicon-containing film. The silicon-containing film is exposed to an organic reactant to form one or more of a silicon-carbon film or a silicon boron film. One or more of the silicon-containing film or the silicon-carbon film or the silicon-boron film is exposed to a plasma.

Additional embodiments of the disclosure are directed to methods of depositing a film on a substrate. At least a portion of the substrate is exposed to a silicon-containing precursor to form a silicon-containing film. The silicon-containing film is exposed to a plasma. The silicon-containing film is exposed to at least one pulse of an organic reactant into the plasma to form a silicon-carbon film.

Further embodiments of the disclosure are directed to methods of depositing a film on a substrate. At least a portion of the substrate is exposed to a silicon-containing precursor to form a silicon-containing film. The silicon-containing film is exposed to an organic reactant to form a silicon-carbon film. The silicon-carbon film is exposed to a plasma to form a silicon carbonitride film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments and are therefore not to be considered limiting of its scope, for the invention may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be described or illustrated herein using structural formulas or names which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Embodiments of the disclosure relate to the PE-ALD of silicon-carbon films (e.g., SiCN films). Embodiments of the disclosure allow for the deposition of SiCN with various plasmas.

When depositing films by plasma enhanced processes, plasma gases such as $NH_3$ and $N_2$ can react with organic moieties to afford volatile amines or nitriles which decrease the carbon content in the films. The incorporation of carbon into silicon nitride based films using precursors that contain carbon, such as bis(trichlorosilyl)methane (BTCSM) have been tried. This precursor does incorporate C by thermal ALD using $NH_3$ gas as the co-reactant at 450° C. However, the films are not very dense and chlorine levels can lead to high etch rates which are not suitable for many applications. When using BTCSM with $NH_3$ plasma, most of the chlorine is gone, however, the carbon is also reacted away leading to a SiN film.

It is also possible to deposit a SiN film, then dope in carbon with ion implanting. Unfortunately, this can damage the film and lead to compositional variations over complex features since ion implantation is directional.

Figure 1:
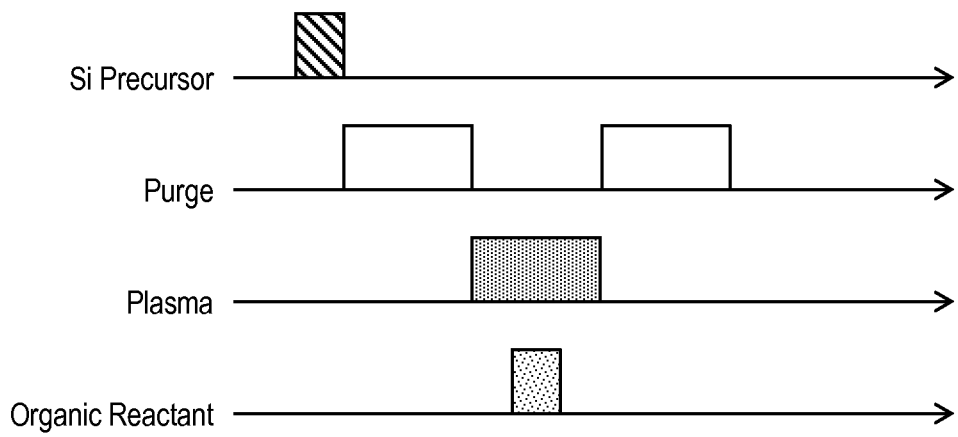
FIG. 1 shows an atomic layer deposition process flow in accordance with one or more embodiments of the disclosure.

Embodiments of the disclosure combine various organic reagents (amines, akanes, alkenes, and alkynes) with a silicon precursor (such as $Si_2Cl_6$, $H_2SiCl_2$, $SiCl_4$, BTBAS, BDEAS) to deposit SiCN or SiC by PE-ALD processes. FIG. 1 illustrates an embodiment of an ALD cycle which comprises, in order, a Si precursor pulse, an inert gas purge (or pump or both), a plasma exposure with an organic co-reactant pulse, and an inert gas purge (or pump or both). Without being bound by any particular theory of operation, it is believed that pulsing the organic reagent during the plasma pulse results in reactive organic species forming (such as NH radicals or methyl radicals) which may be incorporated into the film.

Figure 2:
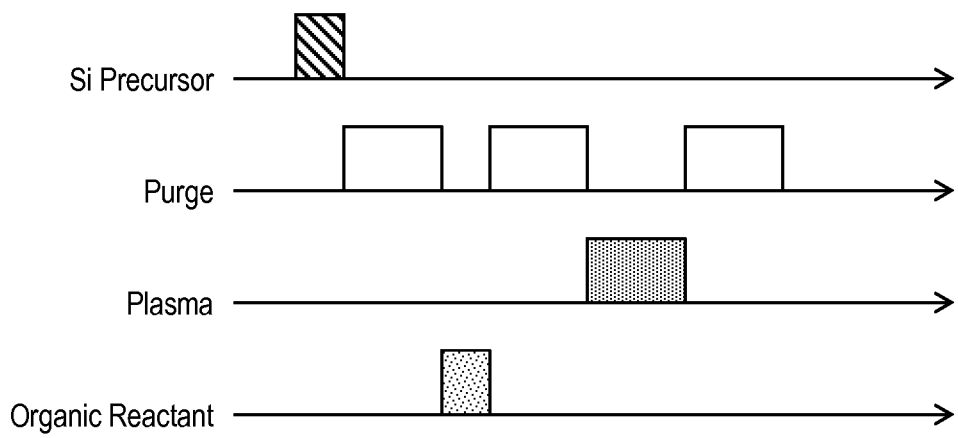
FIG. 2 shows an atomic layer deposition process flow in accordance with one or more embodiments of the disclosure.

FIG. 2 shows another embodiment of the disclosure in which the ALD cycle comprises, in order, a Si precursor pulse, an inert gas purge (or pump or both), an organic co-reactant pulse, an inert gas purge (or pump or both), a plasma treatment, and an inert gas purge (or pump or both). Again, without being bound by any particular theory of operation, in this type of ALD cycle, it is believed that the organic co-reactant may react with the substrate surface and then the plasma treatment densifies the film. It is also believed that the plasma treatment re-activates the substrate surface for the Si precursor in the next cycle.

Embodiments of disclosure allow for the use of silicon precursors to create either SiC or SiCN films by PE-ALD processes using organic molecules as C and N sources. It is believed that silicon precursors containing direct Si—C bonds can be incorporated into the film. Unfortunately plasmas are known to remove carbon from the film by making volatile organic compounds. Embodiments of the disclosure allow for the control of carbon or nitrogen levels in the resulting film. For example, the inventors have found that modifying the organic co-reactants, dosage of the organic co-reactant or plasma conditions (e.g., plasma gas, power, pulse time, etc.) impacts the final composition of the film and the wet etch rates and dielectric constants. As used in this specification and the appended claims, the term "reactant" and "co-reactant" are used interchangeably to refer to gaseous species that can react with a molecule on the substrate surface.

In an embodiment of the disclosure, the use of organic co-reactants incorporates C, N, and/or B into a film. In the case for C and N, any carbon and nitrogen containing molecule could be used to dope in carbon and nitrogen (e.g., amines or nitriles). The inventors have found that any co-reactants that contain just carbon (e.g., acetylene) or boron (e.g., borane) can be used as well.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure any of the film processing steps disclosed may also be performed on an underlayer formed on the substrate as disclosed in more detail below, and the term "substrate surface" is intended to include such underlayer as the context indicates.

In some embodiments, the substrate surface includes a layer that allows a reaction between the substrate surface and precursors used to deposit the Si-containing film. Examples include layers that contain reactive —OH or —NH moieties or handles.

The Si-containing film can be deposited using a variety of deposition processes. In one or more embodiments, the Si-containing film is deposited by atomic layer deposition (ALD), plasma-enhanced atomic layer deposition (PEALD), chemical vapor deposition (CVD), or spin-on dielectric (SOD) deposition. In some embodiments, ALD or PEALD is used so that there is precise control of the thickness of the Si-containing layer.

In an exemplary ALD process, a substrate is exposed to a first precursor such as a silicon precursor that reacts with the substrate surface to provide a monolayer of precursor on all structural surfaces. Silicon precursors include, but are not limited to, halogenated silane, amino-halogenated-silane, or carbo-halogenated-silane precursors that have halogen-terminated bonds. Examples of such halogenated precursors include hexachlorodisilane (HCDS), dichlorosilane (DCS), and bis(trichlorosilyl) methane (BTCSM). In some embodiments, the reaction is self-limiting because the layer has halogen-terminated bonds, thus providing excellent step coverage. In one or more embodiments, the silicon-containing gas (also called the silicon precursor) comprises at least one halogen.

The doped Si-containing film may be a conformal film of any thickness. The film thickness of the doped film may be controlled by depositing a Si-containing film of the thickness, then doping the Si-containing film. In various embodiments, the thickness of the doped Si-containing films is in the range from 2 to 30 nm, such as from 2 to 10 nm. Exemplary film thicknesses may be less than or equal to the following values: 30, 25, 20, 15, 10, 9, 8, 7, 6, 5, 4, 3 or 2 nm.

One or more embodiments of the disclosure are directed to methods of depositing a film on a substrate. It will be understood that depositing a film on a substrate, also means depositing a film on a portion of the surface of a substrate, or onto a surface already formed on the substrate. At least a portion of the substrate is exposed to a silicon-containing precursor to form a silicon-containing film on the substrate. The silicon-containing film can be formed as either a single step reaction or the result of a multi-step reaction. For example, in a single step reaction, the substrate may be exposed to one or more silicon precursors which react with and deposit onto the substrate surface. Subsequent process steps might them react with the deposited silicon film. In a multistep process, the substrate can be exposed to a silicon precursor followed by a reducing agent to silicon film upon which further processing would affect.

The silicon-containing film is then exposed to an organic reactant to form a silicon-carbon film. As used in this specification and the appended claims, the term "silicon-carbon film" refers to a film that has silicon and carbon. For example, a silicon-carbon film could be a silicon carbonitride (SiCN) film or a silicon carboboride (SiCB) film. In some embodiments, the silicon-containing film is exposed to an organic reactant to form a silicon-boron film. As used in this specification and the appended claims, the term "silicon-boron film" refers to a film that has silicon and boron. For example, a silicon-boron film could be silicon boronitride (SiBN) or silicon boride (SiB).

In some embodiments, the organic reactant is an amine. In one or more embodiments, the amine is selected from the group consisting of pyrrole, diethylamine, piperadine, pyridine, quinuclidine, ethylenediamine, t-butylamine, tetramethylenediamene and combinations thereof.

In some embodiments, the organic reactant is an alkane. In one or more embodiments, the alkane is selected from the group consisting of hexane, butane, propane, cyclohexane, cyclopropane and combinations thereof.

In some embodiments, the organic reactant is an alkene. In one or more embodiments, the alkene is selected from the group consisting of hexene, 1,3-hexadiene, 1,4-butadiene, 1,4-cyclohexadiene, propene and combinations thereof In some embodiments, the organic reactant is an alkyne. In one or more embodiments, the alkyne is selected from the group consisting of acetylene, t-butylacetylene, 2,2-dimethyl-1-butyne and combinations thereof.

The silicon-containing film or silicon-carbon film or the silicon-boron film exposed to plasma. The plasma can be formed from any suitable gas. In some embodiments, the plasma is formed from an inert gas selected from the group consisting of nitrogen, argon, helium, neon and combinations thereof.

The order of the plasma exposure can vary. In some embodiments, as shown in FIG. 1, the plasma exposure occurs, or begins, prior to the exposure to the organic reactant. In some embodiments, as shown in FIG. 2, the plasma exposure occurs after exposure to the organic reactant. In some embodiments, the silicon-containing film is exposed to the plasma and the organic reactant at the same time.

Referring to the embodiment shown in FIG. 1, the silicon-containing film is exposed to the plasma and at least one pulse of organic reactant is flowed into the plasma. For example, argon plasma may be generated and exposed to the surface of the substrate where the silicon-containing film has been deposited. Once the plasma exposure begins, after a short delay, the organic reactant is pulsed into the chamber to contact the substrate. The organic reactant does not need to be excited as a plasma but may merely be present within the plasma.

The delay between the onset of the organic reactant after the plasma exposure begins can vary. In some embodiments, the delay is at least about 0.1 second, 0.2 seconds, 0.3 seconds, 0.4 seconds or 0.5 seconds. In some embodiments, the delay is less than about 30 seconds. In one or more embodiments, the delay is in the range of about 0.5 seconds to about 1 second.

The number of pulses of organic reactant during the plasma exposure can also vary. In some embodiments, there are at least two, three or four pulses of organic reactant are flowed into the plasma. The plasma can be stopped between pulses or can be continuous.

The organic reactant and the plasma can be stopped at the same time or different times. In some embodiments, the organic reactant and plasma are stopped at substantially the same time. In one or more embodiments, the flow of the organic reactant is stopped before stopping the plasma.

EXAMPLES

All deposition experiments were carried out at a substrate temperature of about 350° C., with a carrier gas flow of about 200 sccms for HCDS and ethylenediamine. The purge gas flows and plasma gas flows were kept constant at about 1000 sccms, which resulted in a pressure of about 1-3 Torr. The samples were deposited according to the conditions listed in Table 1.

TABLE 1

Sample conditions.

| Example | Pulse Train | Plasma Gas | Plasma Power |
|---|---|---|---|
| A | FIG. 2 | Argon | 100 W |
| B | FIG. 1 | Argon | 50 W |
| C | FIG. 1 | Argon | 100 W |
| D | FIG. 2 | Nitrogen | 100 W |
| E | FIG. 1 | Nitrogen | 50 W |
| F | FIG. 1 | Nitrogen | 100 W |

Figure 3:
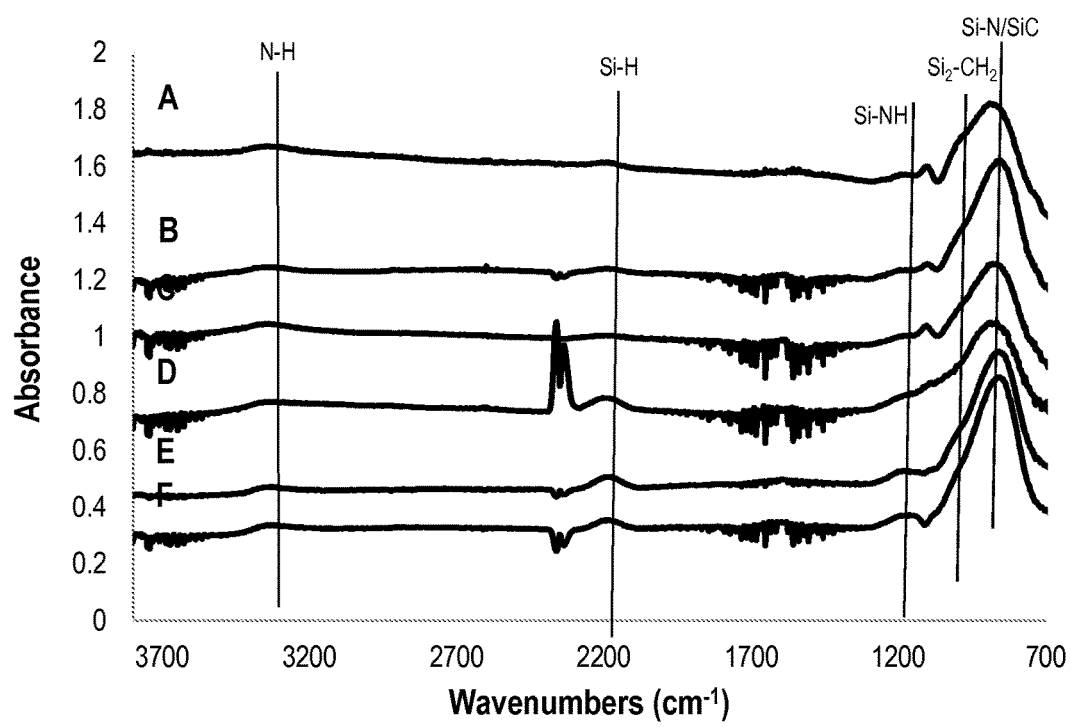
FIG. 3 shows FTIR spectra for films deposited according to one or more embodiments of the disclosure.

FIG. 3 shows the FTIR spectra of films deposited by either the pulse train illustrated In FIG. 1 or FIG. 2 with variable plasma conditions (e.g., gas, power). In all of the spectra in FIG. 3, there is a shoulder peak at about 900 cm$^{-1}$ which is consistent with a $CH_2$ group bridging two Si atoms. Resonances related to Si—N, SiN—H and Si—H bonding modes were also observed. The deposited films contained SiCN with some unknown amount of hydrogen in the film.

Figure 4:
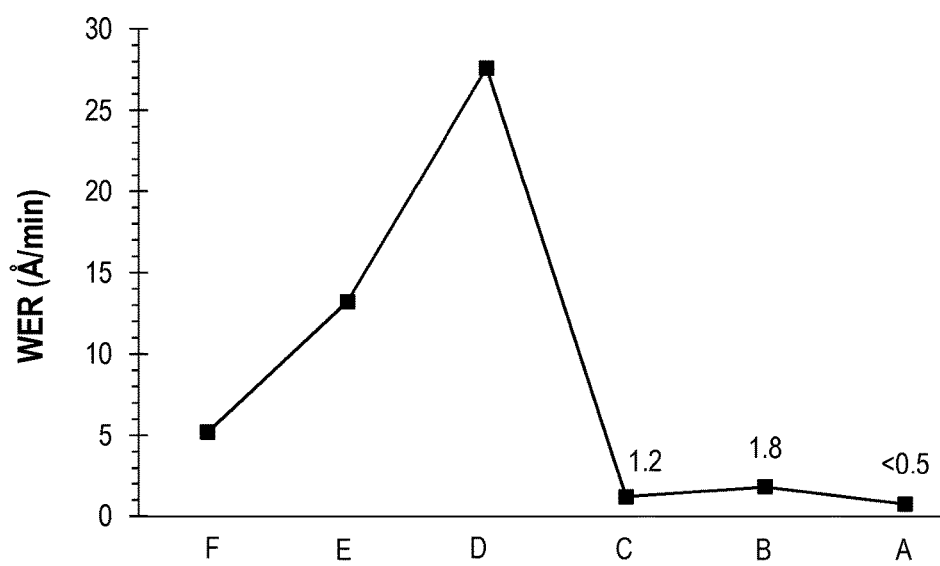
FIG. 4 shows a graph of the wet etch rate as a function of process conditions in accordance with one or more embodiments of the disclosure.

FIG. 4 shows a graph of the wet etch rate (WER) in dilute HF (1:100) as a function of the process conditions. The process conditions were observed to have an effect on the observed WER. When argon plasma was used, the WER was below 5 Å/min and could be further reduced to <0.5 by adjusting the pulse train to that of FIG. 2. Without being bound by any particular theory of operation, it is believed that the lower WER observed for the film deposited by conditions in Example A are likely related to plasma densification and higher carbon incorporation. Argon plasma is believed to densify films better than nitrogen because of the larger size ions, leading to a lower wet etch rate.

Figure 5:
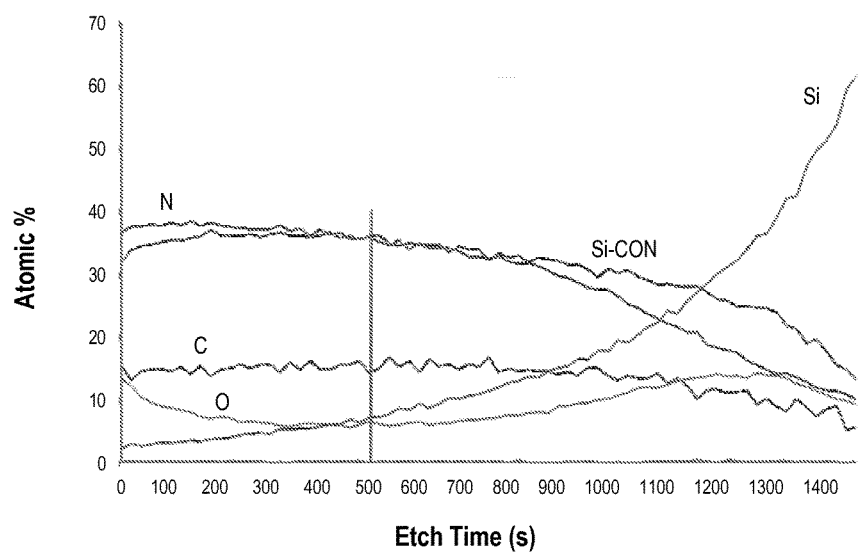
FIG. 5 shows a graph of the XPS atomic percentages of components as a function of the etch time in accordance with one or more embodiment of the disclosure.

FIG. 5 shows x-ray photoelectron spectra (XPS) depth profile analysis on a film according to Example A. The film was deposited to a thickness of about 60 Å. Ionizations corresponding to Si, C and N were present and believed to indicate that SiCN films can be deposited with fairly high C. Additionally, chlorine residues in the film were below the XPS detection limit (<0.5 at. %). Table 2 lists the XPS results at 500 seconds etch time. The oxygen observed in the film (~6 at. %) is believed to be due to the film absorbing 0 from the ambient environment after removal of the film from the deposition chamber.

TABLE 2

XPS depth profile.

| Ionization | Atomic % |
|---|---|
| C 1s | 16.25 |
| Cl 2p | 0.18 |
| N 2s | 35.28 |
| O 1s | 6.05 |
| Si—CON | 35.14 |

According to one or more embodiments, the substrate is subjected to processing prior to and/or after forming the doped Si-containing film. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to a separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before the second precursor is flown. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film on a substrate, the method comprising:
    exposing at least a portion of the substrate to a gaseous silicon-containing precursor to form a silicon-containing film;
    exposing the silicon-containing film to a gaseous organic reactant to form one or more of a silicon-carbon film or a silicon-boron film, the organic reactant comprising one or more of an alkane, an alkene or an alkyne; and
    exposing one or more of the silicon-containing film or the silicon-carbon film or the silicon-boron film to a plasma formed of an inert gas.

2. The method of claim 1, wherein the silicon-containing film is exposed to the plasma prior to exposure to the organic reactant.

3. The method of claim 1, wherein the silicon-containing film is exposed to the plasma after exposure to the organic reactant.

4. The method of claim 1, wherein the silicon-containing film is exposed to the plasma and the organic reactant at the same time.

5. The method of claim 1, wherein the silicon-containing film is exposed to the plasma and at least one pulse of organic reactant is flowed into the plasma.

6. The method of claim 5, wherein there is a delay between onset of the plasma exposure and pulse of organic reactant.

7. The method of claim 6, wherein the delay is at least about 0.2 seconds.

8. The method of claim 6, wherein the delay is less than about 30 seconds.

9. The method of claim 6, wherein the delay is in the range of about 0.5 seconds to about 1 second.

10. The method of claim 5, wherein at least two pulses of organic reactant are flowed into the plasma.

11. The method of claim 5, wherein the organic reactant and plasma are stopped at substantially the same time.

12. The method of claim 5, wherein flow of the organic reactant is stopped before stopping the plasma.

13. The method of claim 1, wherein the organic reactant is an alkane selected from the group consisting of hexane, butane, propane, cyclohexane, cyclopropane and combinations thereof.

14. The method of claim 1, wherein the organic reactant is an alkene selected from the group consisting of hexene, 1,3-hexadiene, 1,4-butadiene, 1,4-cyclohexadiene, propene and combinations thereof.

15. The method of claim 1, wherein the organic reactant is an alkyne selected from the group consisting of acetylene, t-butylacetylene, 2,2-dimethyl-1-butyne and combinations thereof.

16. The method of claim 1, wherein the plasma is formed from an inert gas selected from the group consisting of nitrogen, argon, helium, neon and combinations thereof.

17. The method of claim 1, wherein the silicon-carbon film comprises silicon carbonitride.

18. A method of depositing a film on a substrate, the method comprising:
    exposing at least a portion of the substrate to a gaseous silicon-containing precursor to form a silicon-containing film;
    exposing the silicon-containing film to a plasma of an inert gas; and
    exposing the silicon-containing film to at least one pulse of a gaseous organic reactant into the plasma to form a silicon-carbon film, the organic reactant comprising one or more of an alkane, an alkene or an alkyne.

19. A method of depositing a film on a substrate, the method comprising:
    exposing at least a portion of the substrate to a gaseous silicon-containing precursor to form a silicon-containing film;
    exposing the silicon-containing film to a gaseous organic reactant comprising one or more of an alkane, an alkene or an alkyne to form a silicon-carbon film; and
    exposing the silicon-carbon film to a plasma of an inert gas to form a silicon carbonitride film.

\* \* \* \* \*

UNITED STATES PATENT AND TRADEMARK OFFICE
CERTIFICATE OF CORRECTION

PATENT NO. : 9,685,325 B2
APPLICATION NO. : 14/795521
DATED : June 20, 2017
INVENTOR(S) : Saly et al.

It is certified that error appears in the above-identified patent and that said Letters Patent is hereby corrected as shown below:

On the Title Page

Item (54), Column 1, in "Title", Line 2, delete "SILICON BASED" and insert
-- SILICON-BASED --, therefor.

In the Specification

In Column 1, Line 2, delete "SILICON BASED" and insert -- SILICON-BASED --, therefor.

In Column 6, Line 45, after "absorbing" delete "0" and insert -- O --, therefor.

Signed and Sealed this
Third Day of October, 2017

Joseph Matal
*Performing the Functions and Duties of the*
*Under Secretary of Commerce for Intellectual Property and*
*Director of the United States Patent and Trademark Office*